(12) United States Patent
Ayoub et al.

(10) Patent No.: US 9,143,159 B2
(45) Date of Patent: Sep. 22, 2015

(54) DPD/BCD TO BID CONVERTERS

(71) Applicants: Ahmed A. Ayoub, Cairo (EG); Hossam Aly Hassan Fahmy, Cairo (EG); Tarek Eldeeb, Cairo (EG)

(72) Inventors: Ahmed A. Ayoub, Cairo (EG); Hossam Aly Hassan Fahmy, Cairo (EG); Tarek Eldeeb, Cairo (EG)

(73) Assignee: SilMinds, Inc., Las Vegas, NV (US)

( * ) Notice: Subject to any disclaimer, the term of this patent is extended or adjusted under 35 U.S.C. 154(b) by 55 days.

(21) Appl. No.: 13/644,374

(22) Filed: Oct. 4, 2012

(65) Prior Publication Data

US 2014/0101215 A1 Apr. 10, 2014

(51) Int. Cl.
G06F 7/00 (2006.01)
H03M 7/02 (2006.01)
H03M 7/12 (2006.01)

(52) U.S. Cl.
CPC . *H03M 7/02* (2013.01); *H03M 7/12* (2013.01)

(58) Field of Classification Search
None
See application file for complete search history.

(56) References Cited

U.S. PATENT DOCUMENTS

| | | | |
|---|---|---|---|
| 3,276,013 A | 9/1966 | Chandler | |
| 3,373,269 A | 3/1968 | Rathbun | |
| 3,524,976 A | 8/1970 | Wang | |
| 3,564,225 A | 2/1971 | Watson, Jr. | |
| 3,579,267 A | 5/1971 | Wright | |
| 3,611,349 A | 10/1971 | David | |
| 3,624,374 A | 11/1971 | Steiner | |
| 3,627,998 A | 12/1971 | Hemdal | |
| 3,638,002 A | 1/1972 | Toole | |
| 3,649,822 A | 3/1972 | Mersten | |
| 3,684,878 A | 8/1972 | Schipper | |
| 3,697,733 A | 10/1972 | Toole | |
| 3,705,299 A | 12/1972 | Bastian et al. | |
| 3,866,213 A | 2/1975 | Sather et al. | |
| 3,932,739 A | 1/1976 | Lutz et al. | |
| 4,016,560 A | 4/1977 | Fowler | |
| 4,069,478 A | 1/1978 | Miller | |
| 4,325,056 A | 4/1982 | Wiener | |
| 4,331,951 A | 5/1982 | Flora et al. | |
| 4,430,643 A | 2/1984 | Sevilla | |
| 4,719,450 A | 1/1988 | Yamauchi | |
| 4,792,793 A | 12/1988 | Rawlinson et al. | |
| 4,805,131 A * | 2/1989 | Adiletta et al. | 708/685 |
| 5,251,321 A | 10/1993 | Boothroyd et al. | |
| 6,369,725 B1 | 4/2002 | Busaba | |
| 6,437,715 B1 | 8/2002 | Cowlishaw | |
| 6,525,679 B1 | 2/2003 | Cowlishaw | |
| 7,477,171 B2 | 1/2009 | Mathew et al. | |
| 7,660,838 B2 | 2/2010 | Carlough et al. | |
| 7,698,352 B2 | 4/2010 | Carlough et al. | |
| 2008/0016140 A1 * | 1/2008 | Alagarsamy et al. | 708/673 |
| 2010/0312812 A1 * | 12/2010 | Wang | 708/505 |

OTHER PUBLICATIONS

V. Carreno and P. Miner, "Specification of the ieee-854 floating-point standard in hol and pvs," High Order Logic Theorem Proving and Its Applications, Sep. 1995. (16 pages).

(Continued)

*Primary Examiner* — Michael D Yaary
(74) *Attorney, Agent, or Firm* — Osha Liang LLP

(57) ABSTRACT

A method and system for binary coded decimal (BCD) to binary conversion. The conversion includes obtaining a BCD significand corresponding to multiple decimal digits; generating, by a BCD/binary hardware converter and based on the BCD significand, multiple binary vectors corresponding to the multiple decimal digits; and calculating, by the BCD/binary hardware converter, a binary output by summing the multiple binary vectors.

20 Claims, 8 Drawing Sheets

(56) References Cited

OTHER PUBLICATIONS

IEEE, "IEEE standard for floating-point arithmetic," IEEE Std 754-2008, pp. 1-58, Aug. 2008. (50 pages).

M. Cowlishaw, "General decimal arithmetic specification," World Wide Web. http://www2.hursley.ibm.com/decimal/decarith.-html. register LSD correction transfer digit need to store ge5i signed-digit adder c register t recoders r, Jul. 2008. (10 pages).

M. Cowlishaw, "Densely packed decimal encoding," IEE Proceedings Computers and Digital Techniques, ISSN, pp. 1350-2387, Apr. 2002. (3 pages).

J. Couleur, "Bidec-a binary-to-decimal or decimal-to-binary converter," Electronic Computers, IRE Transactions on, No. 4, pp. 313-316, Aug. 1958. (4 pages).

H. Guild, "Fast decimal-binary conversion," Electronics Letters, vol. 5, No. 18, pp. 427-428, Sep. 1969. (2 pages).

V. Rhyne, "Serial binary-to-decimal and decimal-to-binary conversion," Computers, IEEE Transactions on, vol. 100, No. 9, pp. 808-812, Sep. 1970. (5 pages).

J. Nicoud, "Iterative arrays for radix conversion," Computers, IEEE Transactions on, vol. 100, No. 12, pp. 1479-1489, Dec. 1971. (11 pages).

M. Benedek, "Developing large binary to bcd conversion structures," IEEE Transactions on Computers, Jul. 1977. (9 pages).

M. Schmookler, "High-speed binary-to-decimal conversion," Computers, IEEE Transactions on, vol. 100, No. 5, pp. 506-508, May 1968. (3 pages).

O. Al-Khaleel, Z. Al-Qudah, M. Al-Khaleel, C. Papachristou, and F. Wolff, "Fast and compact binary-to-bcd conversion circuits for decimal multiplication," in Computer Design (ICCD), 2011 IEEE 29th International Conference on, pp. 226-231, IEEE, Oct. 2011. (6 pages).

G. Jaberipur and a. Kaivani, "Binary-coded decimal digit multipliers," Computers & Digital Techniques, IET, vol. 1, No. 4, pp. 377-381, Jul. 2007. (5 pages).

R. James, T. Shahana, K. Jacob, and S. Sasi, "Decimal multiplication using compact bcd multiplier," in Electronic Design, 2008. ICED 2008. International Conference on, pp. 1-6, IEEE, Dec. 2008. (6 pages).

S. Veeramachaneni and M. Srinivas, "Novel high-speed architecture for 32-bit binary coded decimal (bcd) multiplier," in Communications and Information Technologies, 2008. ISCIT 2008. International Symposium on, pp. 543-546, IEEE, Oct. 2008. (4 pages).

J. Bhattacharya, a. Gupta, and a. Singh, "A high performance binary to bcd converter for decimal multiplication," in VLSI Design Automation and Test (VLSIDAT), 2010 International Symposium on, pp. 315-318, IEEE, Apr. 2010. (4 pages).

* cited by examiner

DPD/BCD TO BID CONVERTERS

BACKGROUND

Decimal arithmetic has a growing need in many commercial applications, financial applications, green energy applications, billing applications, and database systems where binary arithmetic is not sufficient because of the inexact mapping between some decimal and binary numbers. For example, the decimal number 0.1 does not have an exact binary representation. Moreover, decimal arithmetic is the norm of human calculations.

SUMMARY OF INVENTION

In general, in one aspect, the invention relates to a method. The method comprises: obtaining a binary coded decimal (BCD) significand corresponding to a plurality of decimal digits; generating, by a BCD/binary hardware converter and based on the BCD significand, a plurality of binary vectors corresponding to the plurality of decimal digits; and calculating, by the BCD/binary hardware converter, a binary output by summing the plurality of binary vectors.

In general, in one aspect, the invention relates to a system. The system comprises: a binary coded decimal (BCD)/binary hardware converter configured to: input a BCD significand corresponding to a plurality of decimal digits; generate, based on the BCD significand, a plurality of binary vectors corresponding to the plurality of decimal digits; and calculate a binary output based on the plurality of binary vectors.

Other aspects of the invention will be apparent from the following description and the appended claims.

DETAILED DESCRIPTION

Figure 1:
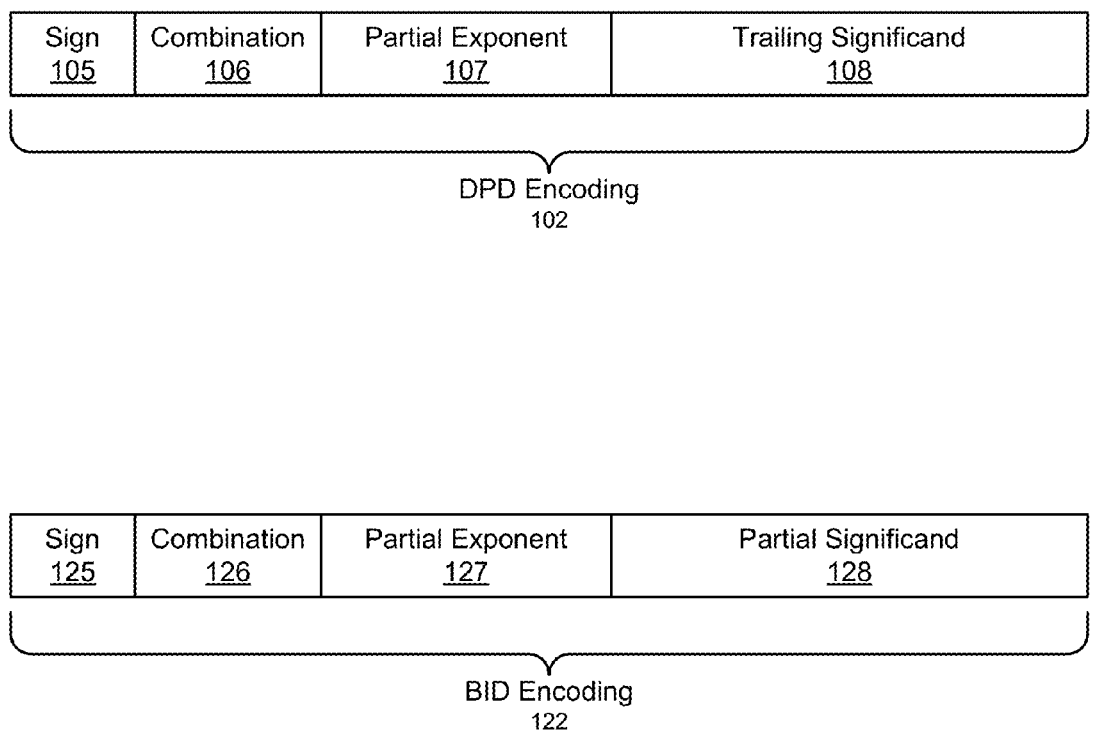
FIG. 1 shows a densely packed decimal (DPD) encoding and a binary integer decimal (BID) encoding in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The value of a decimal floating point number may be expressed as $(-1)^S \times 10^{(E-bias)} \times C$, where S is 0 for a positive decimal floating point number and 1 for a negative decimal floating point number, E is a non-negative biased exponent, bias is a constant value added to the true exponent that results in E, and C is the significand (i.e., a series of decimal digits). The decimal floating point number may be represented in densely packed decimal (DPD) encoding or a binary integer decimal (BID) encoding.

FIG. 1 shows a DPD encoding (102) in accordance with one or more embodiments of the invention. The DPD encoding (102) may be 32 bits (i.e., DPD32), 64 bits (i.e., DPD64), 128 bits (i.e., DPD128), 256 bits (i.e., DPD256), etc. in size. As shown in FIG. 1, the DPD encoding (102) has a sign field (105), a combination field (106), a partial exponent field (107), and a trailing significand field (108). The sign field (105) is a single bit and stores 0 for a positive value or 1 for a negative value. The combination field (106) is five bits and encodes the leading two bits of the biased exponent and the leading digit of the significand. The partial exponent field (107) stores the less significant bits (i.e., all but the two leading bits) of the biased exponent. The size of the partial exponent field (107) depends on the size of the DPD encoding. For example, in DPD64 and DPD128, the partial exponent field (107) is 8 bits and 12 bits in size, respectively. The trailing significand field (108) encodes the remaining digits (i.e., all but the leading digit) of the significand using DPD encoding. Specifically, the trailing significand field (108) includes groups of 10-bit declets. Each declet encodes three decimal digits using DPD encoding. The size of the trailing significand field (108) depends on the size of the DPD encoding. For example, in DPD64 and DPD128, the trailing significand field (108) is 50 bits and 110 bits in size, respectively.

If the leading two bits of the combination field (106) are "00", "01", or "10", then those are the leading bits of the biased exponent, and the three remaining bits in the combination field (106) are interpreted as the leading decimal digit (0 to 7) in the significand. If the leading 4 bits of the combination field (106) are "1100", "1101", or "1110", then the third and fourth bit of the combination field (106) are the two leading bits of the biased exponent, and the final bit of the combination field (106) is prefixed with "100" to form the leading decimal digit (8 or 9) in the significand. The remaining two combinations (i.e., "11110" and "11111") of the combination field (106) are used to represent ±infinity and "not a number" (i.e., NaNs), respectively.

FIG. 1 also shows a BID encoding (122) in accordance with one or more embodiments of the invention. The BID encoding (122) may be 32 bits (i.e., BID32), 64 bits (i.e., BID64), 128 bits (i.e., BID128), 256 bits (i.e., BID256), etc. in size. As shown in FIG. 1, the BID encoding (122) has a sign field (125), a combination field (126), a partial exponent field (127), and a partial significand field (128). The sign field (125) is a single bit and stores 0 for a positive value or 1 for a negative value.

If the two bits immediately following the sign field (125) are "00", "01", or "10", then the combination field (126) is only two bits in size, and the bits of the biased exponent correspond to the concatenation of the combination field (126) and the partial exponent field (127). If the two bits immediately following the sign field (125) are "11", the combination field (126) is four bits in size, and the bits of the biased exponent correspond to the concatenation of the least significant two bits of the combination field (126) with the bits in the partial exponent field (127). The size of the partial exponent field (127) depends on the size of the BID encoding. For example, in BID64 and BID128, the partial exponent field (127) is 8 bits and 12 bits in size, respectively. If the four bits immediately following the sign field (125) are "1111", the BID encoding (122) is representing ±infinity or "not a number" (i.e., NaNs).

If the leading bit of the significand is "0", the "0" is omitted and the partial significand field (128) stores the remaining bits. In other words, when the leading two bits of the combination field (126) are not "11", the true significand is the bits of the partial significand field (128) with an implicit leading "0". If the leading bits of the significand are "100", the "100" is omitted, the partial significand field (128) stores the remaining bits of the significand, and the leading two bits of the combination field (126) are set to "11". In other words, when the leading two bits of the combination field (126) are "11", the true significand is the bits of the partial significand field (128) with an implicit leading "100". The size of the partial significand field (128) depends on both the size of the BID encoding and the leading bit(s) of the true significand. For example, in BID64, if the true significand has a leading bit of "0", the partial significand field (128) is 53 bits in size. However, if the true significand has the leading bit sequence "100," the partial significand field (128) is 51 bits in size.

Figure 2:
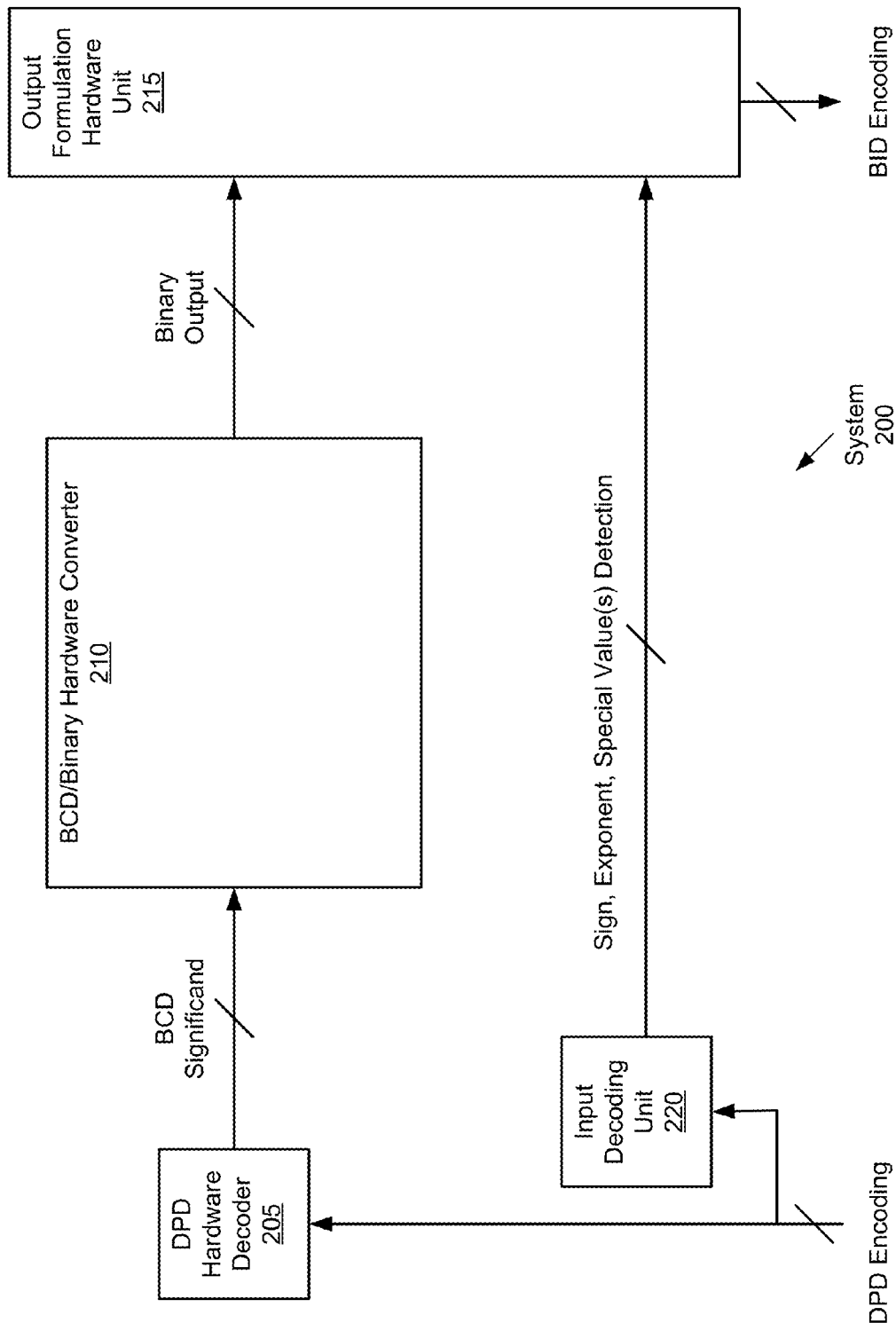
FIG. 2 shows a block diagram depicting a system in accordance in with one or more embodiments of the invention.

FIG. 2 shows a system (200) in accordance with one or more embodiments of the invention. The system (200) may convert a DPD encoding into a BID encoding. As shown in FIG. 2, the system has multiple hardware components including a DPD hardware decoder (205), a BCD/binary hardware converter (210), an output formulation hardware unit (215), and an input decoding unit (220). One or more of the hardware components (205, 210, 215, 220) may be embedded within one or more general purpose processor cores, field programmable gate arrays (FPGAs), and/or application specific integrated circuits (ASICs).

In one or more embodiments of the invention, the system (200) includes the DPD hardware decoder (205). As shown in FIG. 2, the DPD hardware decoder (205) inputs a DPD encoding (discussed above) of a decimal floating point number. The DPD hardware decoder (205) may include one or more logic units (i.e., circuits) to: extract the trailing significand from the DPD encoding; convert the trailing significand to a set of binary coded decimal (BCD) bits; decode/extract a set of BCD bits corresponding to the most significant digit from the DPD encoding; and generate a BCD significand by concatenating the set of BCD bits corresponding to the most significant digit with the set of BCD bits corresponding to the trailing significand. As also shown in FIG. 2, the DPD hardware decoder (205) outputs the BCD significand.

In one or more embodiments of the invention, the system (200) includes the BCD/binary hardware converter (210). As shown in FIG. 2, the BCD/binary hardware converter (210) inputs a BCD significand corresponding to multiple decimal digits. The BCD/binary hardware converter (210) may include one or more logic units (i.e., circuits) (discussed below) to: generate multiple binary vectors corresponding to the plurality of decimal digits; and generate a binary output by summing the binary vectors. Specifically, the BCD/binary hardware converter (210) may use truth-tables, multiplexers, and/or adder trees (e.g., carry-save adder tree) to generate the binary output from the BCD significand (discussed below).

In one or more embodiments of the invention, the system (200) includes the input decoding unit (220). The input decoding unit (220) inputs the DPD encoding of the decimal floating point number. The input decoding unit (220) may include one or more logic units (i.e., circuits) to: extract the sign of the decimal floating point number from the DPD encoding; extract the two leading exponent bits from the combination field of the DPD encoding; extract the partial exponent bits from the partial exponent field of the DPD encoding; concatenate the two leading exponent bits and the partial exponent bits to form the biased exponent; and detect special values (e.g., NaN, infinity, etc.). As also shown in FIG. 2, the input decoding unit (220) outputs the sign, the extracted biased exponent and/or the detected special value.

In one or more embodiments of the invention, the system (200) includes the output formulation hardware unit (215). As shown in FIG. 2, the output formulation hardware unit (215) inputs the binary output; the sign; the extracted biased exponent (e.g., the two leading exponent bits and the partial exponent bits extracted from the DPD encoding); and/or the detected special value. The output formulation hardware unit (215) may include one or more logic units (i.e., circuits) to generate a binary integer decimal (BID) encoding of the decimal floating point number from the sign, the biased exponent, and the binary output. As also shown in FIG. 2, the output formulation hardware unit (215) outputs the BID encoding.

In one or more embodiments of the invention, the system (200) includes solely the BCD/binary hardware converter (210). In other words, in such embodiments, the DPD hardware decoder (205), the input decoding unit (220), and the output formulation hardware unit (215) are omitted. Moreover, the BCD/binary hardware converter (210) may input a BCD significand from any source, and output the corresponding binary value (i.e., the binary output) to any sink.

Figure 3A:
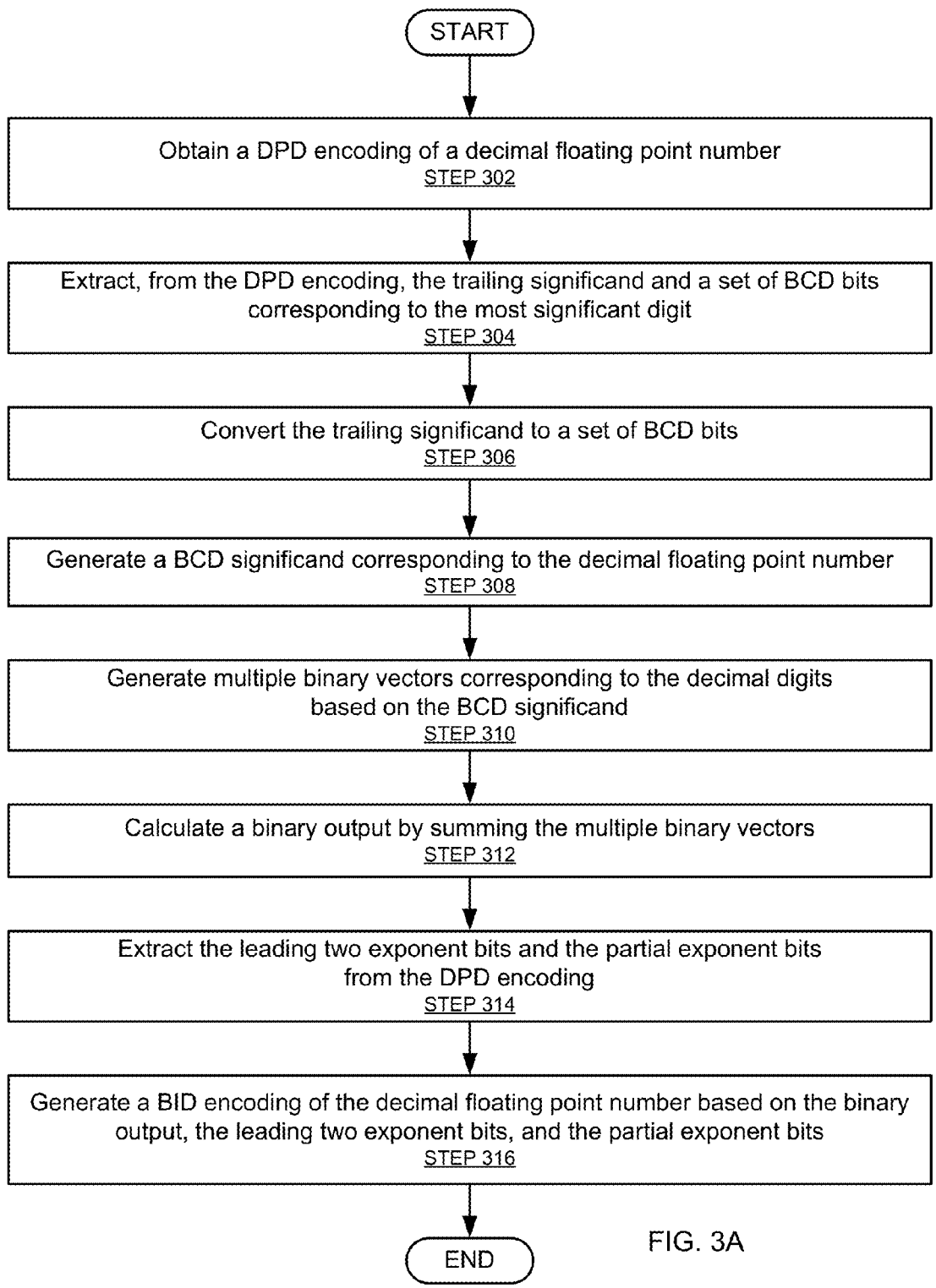
FIG. 3A and FIG. 3B show flowcharts in accordance with one or more embodiments of the invention.

FIG. 3A shows a flowchart in accordance with one or more embodiments of the invention. The process shown in FIG. 3A may be used, for example, with the components of system (200) (e.g., DPD Hardware Decoder (205), BCD/Binary Hardware Converter (210), Input Decoding Unit (220), and Output Formulation Hardware Unit (215), discussed above in reference to FIG. 2) to convert a DPD encoding into a BID encoding. One or more steps shown in FIG. 3A may be omitted, repeated, and/or performed in a different order among different embodiments of the invention. Accordingly, embodiments of the invention should not be considered limited to the specific number and arrangement of steps shown in FIG. 3A.

Initially, a DPD encoding of a decimal floating point number is obtained (STEP 302). As discussed above, the DPD encoding includes a sign field, a combination field, a partial exponent field, and a trailing significand field. The DPD encoding may be of any size including 32 bits, 64 bits, 128 bits, 256 bits, etc.

In STEP 304, a set of BCD bits corresponding to the most significant digit of the decimal floating point number and the trailing significand are extracted from the DPD encoding. Specifically, the most significant digit is decoded from the combination field of the DPD encoding.

In STEP 306, the trailing significand is converted in to a set of BCD bits. As discussed above, the trailing significand includes groups of 10-bit declets. Each declet encodes three decimal digits using DPD encoding. In contrast, in BCD encoding, each decimal digit is encoded using 4 bits. DPD encoding can be converted to BCD encoding with minimal (e.g., two or three) gate delays. In STEP 308, a BCD significand is generated by concatenating the set of BCD bits corresponding to the most significant digit with the set of BCD bits corresponding to the converted trailing significand.

In STEP 310, multiple binary vectors corresponding to the decimal digits are generated based on the BCD significand. The binary vectors may be generated from truth-tables and multiplexers (discussed below). In STEP 312, a binary output is generated by summing the multiple binary vectors (e.g., using a carry-save adder tree).

In STEP 314, the leading two exponent bits and the partial exponent bits are extracted from the DPD encoding. In STEP 316, a BID encoding of the decimal floating point number is generated based on the binary output, the leading two exponent bits, and the partial exponent bits.

As discussed above, DPD encoding format uses 10 bits to represent every three consecutive decimal digits in the decimal significand. In DPD64, the DPD trailing significand field size is 50 bits and consists of 5 declets (i.e., 1 declet=10 bits). As each declet can be converted into 3 decimal digits (12 bits in BCD), the 50 DPD trailing significand bits are converted by the DPD hardware decoder (205) into 60 BCD bits (i.e., 5 declets×12 BCD bits/declet). The resulting BCD significand is 64 bits (16 decimal digits): 4 BCD bits corresponding to the decoded most significant digit concatenated with the 60 BCD bits corresponding to the converted trailing significand.

In DPD128, the DPD trailing significand field size is 110 bits and consist of 11 declets. As each declet can be converted into 3 decimal digits (12 bits in BCD), the 110 DPD trailing significand bits are converted by the DPD hardware decoder (205) into 132 BCD bits (i.e., 11 declets×12 BCD bits/declet). The resulting BCD significand is 136 bits (34 decimal digits): 4 BCD bits corresponding to the decoded most significant digit concatenated with the 132 BCD bits corresponding to the trailing significand.

In DPD64 encoding format, the maximum expected decimal value of the BCD significand is 9 999 999 999 999 999 (16 digits) which equals 23 86F2 6FC0 FFFF in Hexadecimal (54 bits size). Accordingly, with respect to DPD64, the input into the BCD/binary hardware converter (210) has a width of 64 bits, while the output of the BCD/binary hardware converter (210) has a width of 54 bits.

In DPD128 encoding format, the maximum expected decimal value of the BCD significand has a size of 136 bits, while the converted binary format has maximum size of 114 bits. Accordingly, with respect to DPD128, the input into the BCD/binary hardware converter (210) has a width of 136 bits, while the output of the BCD/binary hardware converter (210) has a width of 114 bits.

Figure 3B:
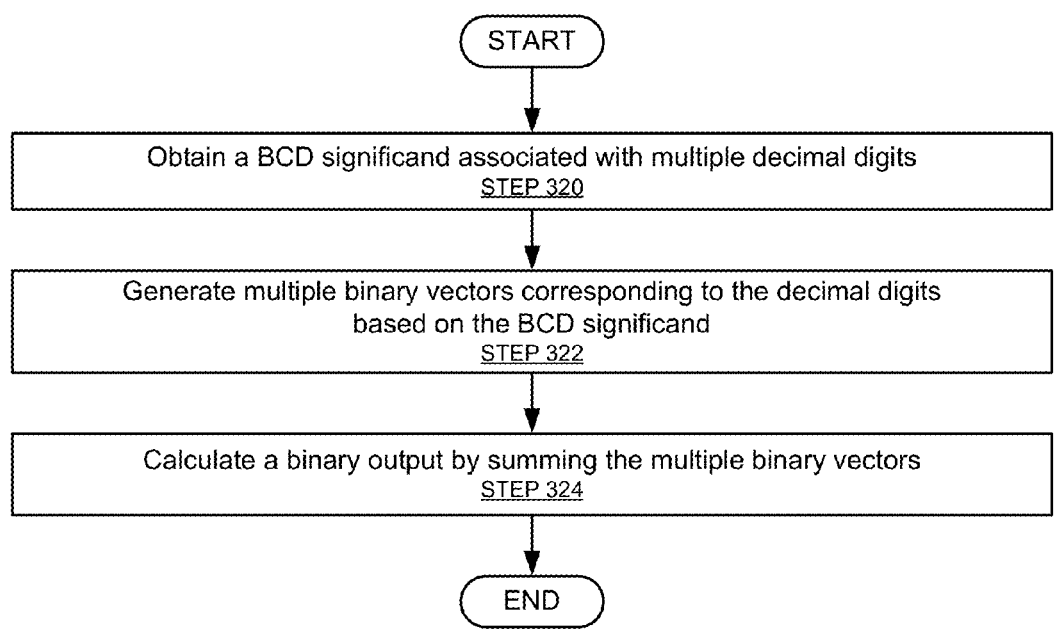

FIG. 3B shows a flowchart in accordance with one or more embodiments of the invention. The process shown in FIG. 3B may be used, for example, with the BCD/Binary Hardware Converter (210), discussed above in reference to FIG. 2, to convert a BCD significand into a binary output. One or more steps shown in FIG. 3B may be omitted, repeated, and/or performed in a different order among different embodiments of the invention. Accordingly, embodiments of the invention should not be considered limited to the specific number and arrangement of steps shown in FIG. 3B.

Initially, a BCD significand is obtained (STEP 320). The BCD significand may be obtained from any source and may be of any size.

In STEP 322, multiple binary vectors corresponding to the decimal digits are generated based on the BCD significand. The binary vectors may be generated from truth-tables and multiplexers (discussed below).

In STEP 324, a binary output is generated by summing the multiple binary vectors (e.g., using a carry-save adder tree). The binary output may be sent to any sink.

As discussed above, the BCD/binary hardware converter (210) converts the BCD significand to the binary output. In one or more embodiments of the invention, the BCD/binary hardware converter (210) converts each digit (4 BCD bits) in the BCD significand with the digit's weight to a binary vector. This results in (¼×BCD significand width) binary vectors. The BCD/binary hardware converter (210) sums these multiple binary vectors to obtain the binary output. For example, if the BCD significand is decimal 932, the BCD significand is divided into decimal 900, decimal 30, and decimal 2. The multiple binary vectors may be generated by converting each of decimal 900, decimal 30, and decimal 2 into binary. The binary output is obtained by summing the binary vectors.

Truth-Table Embodiments

In one or more embodiments of the invention, the BCD/binary hardware converter (210) includes one or more full truth-tables covering all possible digits in each weighted location. The full truth-table(s) input the decimal digits (4 BCD bits/digit) of the BCD significand and output one binary vector for each decimal digit. For example, assume the BCD significand had a size of three decimal digits: XYZ. In this case, the full truth-table(s) store three sets (set A, set B, set C) of binary vectors. Set A contains binary vectors corresponding to the binary versions of {0, 1, 2, 3, 4, 5, 6, 7, 8, 9}. The binary vector from set A is selected based on Z. Set B contains the binary vectors corresponding to the binary values of {0, 10, 20, 30, 40, 50, 60, 70, 80, 90}. The binary vector from set B is selected based on Y. Set C contains binary vectors corresponding to the binary values of {0, 100, 200, 300, 400, 500, 600, 700, 800, 900}. The binary vector from set C is selected based on X. The binary vectors may correspond to the binary vectors of STEP 310 and STEP 322, discussed above in reference to FIG. 3A and FIG. 3B, respectively.

In the case of DPD64, the BCD significand has 16 digits, and there is a set of 10 possible binary vectors for each digit position. Accordingly, the overall size for the full truth-table will be 8,640 bits=16 digits×10 possible binary numbers for each digit×54 bit size for each possible binary number.

In the case of DPD128, the BCD significand has 34 digits, and there is a set of 10 possible binary vectors for each digit position. Accordingly, the overall size for the full truth-table will be 38,760 bits=34 digits×10 possible binary numbers for each digit×114 bit size for each possible binary number.

DIGIT2BIN Units Storing Two Binary Representations

In one or more embodiments of the invention, the BCD/binary hardware converter (210) has multiple DIGIT2BIN units. Specifically, there exists one DIGIT2BIN unit for each digit of the BCD significand. Each DIGIT2BIN unit has a register set storing a binary representation of decimal (1×w) and a binary representation of decimal (3×w), where w is the weight (e.g., 1, 10, 100, 1000, 10000, etc.) of the BCD decimal digit corresponding to the DIGIT2BIN unit. Further, each DIGIT2BIN unit has a set of multiplexers that are operatively connected to the register set. One or more of the multiplexers input, from the register set, the binary representation of decimal (1×w), the binary representation of decimal (3×w), a shifted version of the binary representation of decimal (1×w) (e.g., shifted left by one bit), and a shifted version of the binary representation of decimal (3×w) (e.g., shifted left by one bit). The multiplexers may also input 0. The multiplexers select from the inputs based on the BCD digit corresponding to the DIGIT2BIN unit where the multiplexers are located. The outputs of the set of multiplexers form a binary vector. In other words, each multiplexer may output a component of the binary vector.

Those skilled in the art, having the benefit of this detailed description, will appreciate that by shifting a binary representation left by one bit, the value of the binary representation doubles. Accordingly, the multiplexers are effectively inputting a binary representation of decimal (1×w), a binary representation of decimal (1×w×2=2×w), a binary representation of decimal (3×w), and a binary representation of decimal (3×w×2=6×w).

Figure 4:
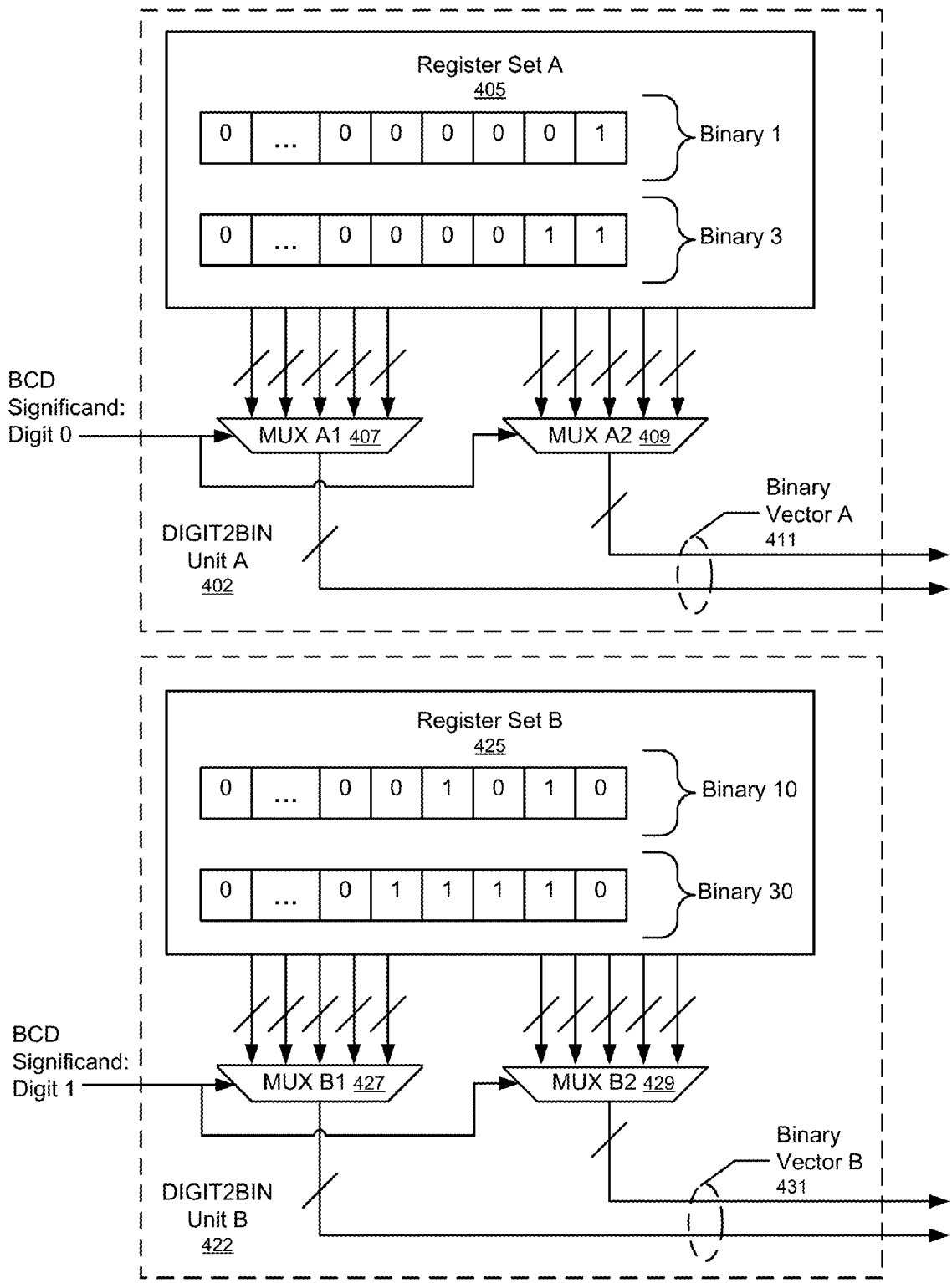
FIG. 4 and FIG. 5 show DIGIT2BIN units in accordance with one or more embodiments of the invention.

FIG. 4 shows multiple DIGIT2BIN units (i.e., DIGIT2BIN Unit A (402), DIGIT2BIN Unit B (422)) in accordance with one or more embodiments of the invention. As shown in FIG. 4, DIGIT2BIN Unit A (402) inputs the least significant digit (D0, w=1) of the BCD significand, and outputs binary vector A (411). Further, DIGIT2BIN Unit A (402) has register set A (405) storing a binary representation of decimal (1×w=1×1=1) and a binary representation of decimal (3×w=3×1=3). Further still, DIGIT2BIN Unit A (402) has a set of multiplexers (i.e., MUX A1 (407), MUX A2 (409)) that input: 0; the binary representation of decimal 1; the binary representation of decimal 3; the binary representation of decimal (1×2=2); and/or the binary representation of decimal (3×2=6). The selector signal for the multiplexers (407, 409) is the decimal digit D0 (i.e., 4 BCD bits) of the BCD significand.

For example, assume D0=8. The binary representations of decimal 1, decimal 2, decimal 3, and decimal 6 are available for selection by the multiplexers (407, 409). The binary representation of decimal 8 may be obtained if MUX A1 (407) selects/outputs the binary representation of decimal 6 and MUX A2 (409) selects/outputs the binary representation of decimal 2, and the two outputs are (eventually) summed.

As also shown in FIG. 4, DIGIT2BIN Unit B (422) inputs the second least significant digit (D1, w=10) of the BCD significand, and outputs binary vector B (431). Further, DIGIT2BIN Unit B (422) has register set B (425) storing a binary representation of decimal (1×w=1×10=10) and a binary representation of decimal (3×w=3×10=30). Further still, DIGIT2BIN Unit B (422) has a set of multiplexers (i.e., MUX B1 (427), MUX B2 (429)) that input: 0; the binary representation of decimal 100; the binary representation of decimal 30; the binary representation of decimal (10×2=20); and/or the binary representation of decimal (30×2=60). The selector signal for the multiplexers (427, 429) is the decimal digit D1 (i.e., 4 BCD bits) of the BCD significand.

The binary vectors (411, 431) may correspond to the binary vectors of STEP 310 or STEP 322, discussed above in reference to FIG. 3A and FIG. 3B, respectively. As discussed above, in DPD64 the BCD significand has 16 decimal digits. Accordingly, there will be 16 DIGIT2BIN units, each storing two values (e.g., (1, 3), (10, 30), (100, 300), (1000, 3000), etc.), for a total of 32 stored values. As also discussed above, in DPD128 the BCD significand has 34 decimal digits. Accordingly, there will be 34 DIGIT2BIN units, each storing two values (e.g., (1, 3), (10, 30), (100, 300), (1000, 3000), etc.), for a total of 68 stored values.

DIGIT2BIN Units Storing One Binary Representation

In one or more embodiments of the invention, the BCD/binary hardware converter (210) has multiple DIGIT2BIN units. Specifically, there exists one DIGIT2BIN unit for each digit of the BCD significand. Each DIGIT2BIN unit has a register storing a binary representation of decimal (1×w), where w is the weight (e.g., 1, 10, 100, 1000, 10000, etc.) of the BCD decimal digit corresponding to the DIGIT2BIN unit. Further, each DIGIT2BIN unit has a set of multiplexers that are operatively connected to the register. One or more of the multiplexers input, from the register, the binary representation of decimal (1×w), a shifted version of the binary representation of decimal (1×w) (e.g., shifted left by one bit), a double shifted version of the binary representation of decimal (1×w) (e.g., shifted left by two bits), and a triple shifted version of the binary representation of decimal (1×w) (e.g., shifted left by three bits). The multiplexers may also input 0. The multiplexers select from the inputs based on the BCD digit corresponding to the DIGIT2BIN unit where the multiplexers are located. Each multiplexer outputs an internal binary vector. The internal binary vectors are summed using an adder (e.g., a 3:2 carry-save adder), and the output of the adder is a binary vector corresponding to the binary vectors in STEP 310 or STEP 322, discussed above in reference to FIG. 3A and FIG. 3B, respectively.

Those skilled in the art, having the benefit of this detailed description, will appreciate that by shifting a binary representation left by one bit, the value of the binary representation doubles. Accordingly, the multiplexers are effectively inputting a binary representation of decimal (1×w), a binary representation of decimal (1×w×2=2×w), a binary representation of decimal (1×w×2×2=4×w), and a binary representation of decimal (1×w×2×2×2=8×w).

Figure 5:
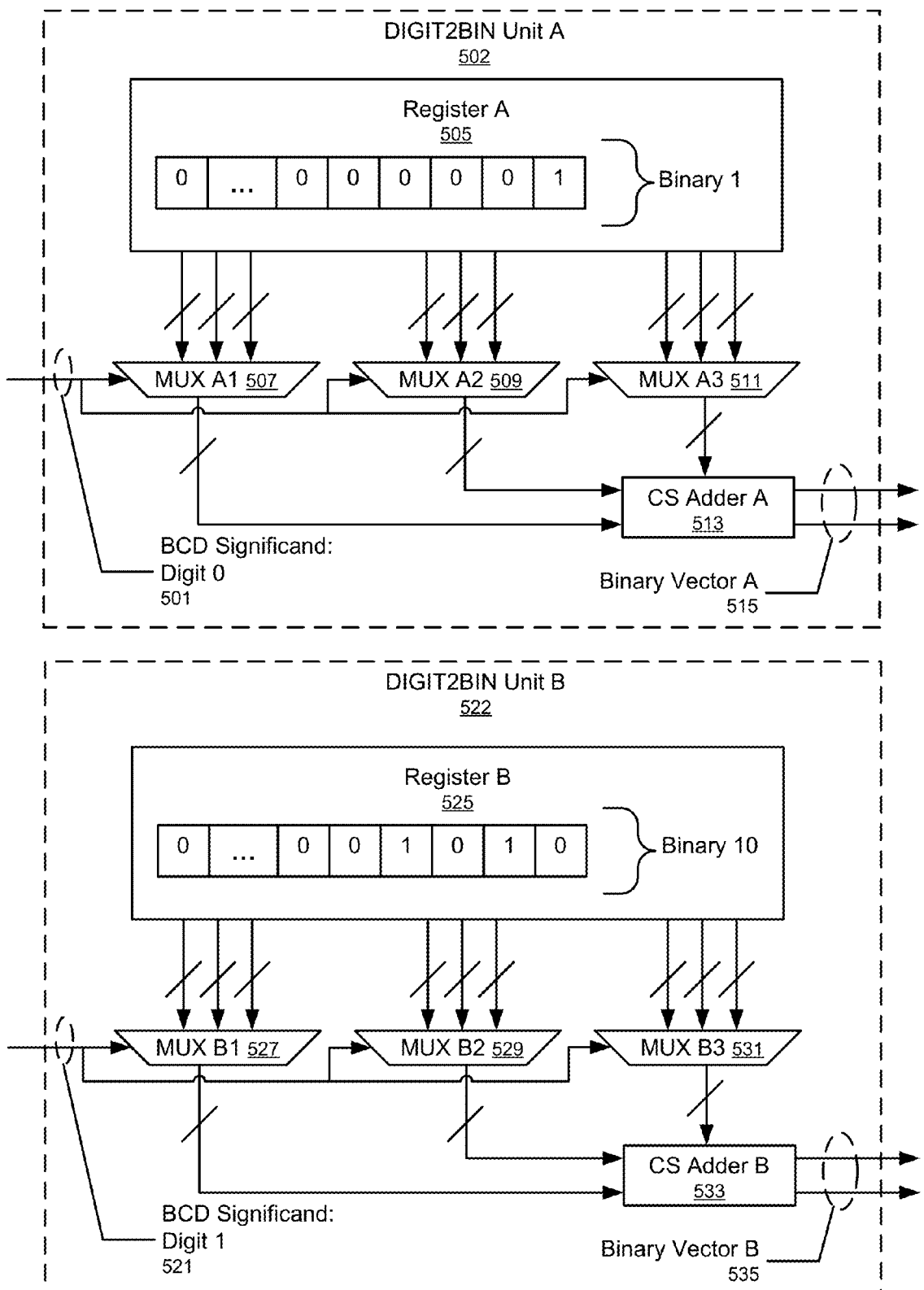

FIG. 5 shows multiple DIGIT2BIN units (i.e., DIGIT2BIN Unit A (502), DIGIT2BIN Unit B (522)) in accordance with one or more embodiments of the invention. As shown in FIG. 5, DIGIT2BIN Unit A (502) inputs the least significant digit (D0, w=1) of the BCD significand (501), and outputs binary vector A (515). Further, DIGIT2BIN Unit A (502) has register A (505) storing a binary representation of decimal (1×w=1×1=1). Further still, DIGIT2BIN Unit A (502) has a set of multiplexers (i.e., MUX A1 (507), MUX A2 (509), MUX A3 (511)) that input: 0; the binary representation of decimal 1; the binary representation of decimal (1×2=2); the binary representation of decimal (1×2×2=4); and/or the binary representation of decimal (1×2×2×2=8). The selector signal for the multiplexers (507, 509, 511) is the decimal digit D0 (i.e., 4 BCD bits) of the BCD significand. The outputs of the multiplexers (507, 509, 511) are summed by carry-save (CS) adder A (513) to generate binary vector A (515).

For example, assume D0=7. The binary representations of decimal 1, decimal 2, decimal 4, and decimal 8 are available for selection by the multiplexers (507, 509, 511). The binary representation of decimal 7 may be obtained if MUX A1 (507) selects/outputs the binary representation of decimal 1, MUX A2 (509) selects/outputs the binary representation of decimal 2, MUX A3 (511) selects/outputs the binary representation of decimal 4, and the three internal binary vectors (i.e., outputs of the multiplexers) are summed by CS Adder A (513).

As shown in FIG. 5, DIGIT2BIN Unit B (522) inputs the second least significant digit (D1, w=10) of the BCD significand (521), and outputs binary vector B (535). Further, DIGIT2BIN Unit B (522) has register B (525) storing a binary representation of decimal (1×w=1×10=10). Further still, DIGIT2BIN Unit B (522) has a set of multiplexers (i.e., MUX B1 (527), MUX B2 (529), MUX B3 (531)) that input: 0; the binary representation of decimal 10; the binary representation of decimal (10×2=20); the binary representation of decimal (10×2×2=40); and/or the binary representation of decimal (10×2×2×2=80). The selector signal for the multiplexers (527, 529, 531) is the decimal digit D1 (i.e., 4 BCD bits) of the BCD significand. The outputs of the multiplexers (527, 529, 531) are summed by carry-save (CS) adder B (533) to generate binary vector B (535).

Adder Tree

In one or more embodiments of the invention, the BCD/binary hardware converter (210) includes an adder tree. The adder tree inputs the binary vectors generated by the DIGIT2BIN units (discussed above in reference to FIG. 4 and FIG. 5) and calculates a binary output corresponding to the binary output in STEP 312 or STEP 324, discussed above in reference to FIG. 3A and FIG. 3B, respectively.

In one or more embodiments of the invention, the adder tree is a carry-save adder tree. The carry-save adder tree has multiple levels of 3:2 carry-save adders to sum the binary vectors from the DIGIT2BIN units (402, 422, 502, 522). Each 3:2 carry-save adder sums three binary vectors and outputs the result in sum/carry form. At the last stage, when only two binary vectors remain, a binary adder is used to calculate the binary output by summing the remaining two binary vectors.

Figure 6:
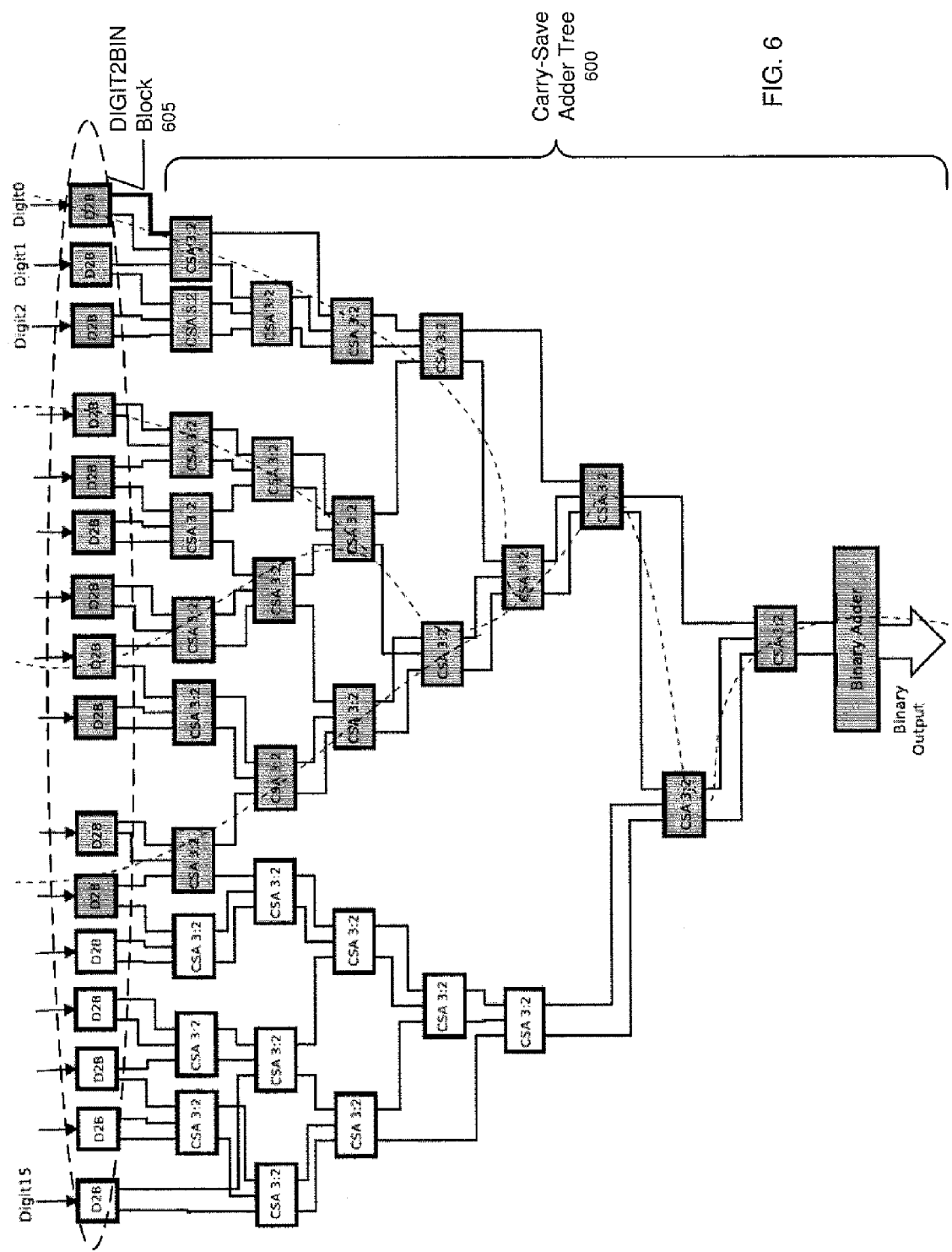
FIG. 6 shows an adder tree in accordance with one or more embodiments of the invention.

FIG. 6 shows a carry-save adder tree (600) for DPD64. As shown in FIG. 6, there exists a DIGIT2BIN Block (605) having multiple DIGIT2BIN units. The carry-save adder tree (600) sums the binary vectors generated by the DIGIT2BIN Block (605). The grey shading in FIG. 6 shows the possible critical path(s). As also shown in FIG. 6, there are 8 levels of 3:2 carry-save adders. The multiple levels of 3:2 carry-save adders feed into the binary adder. A carry-save adder tree for DPD128 would be similar, except the DIGIT2BIN Block (605) would have additional DIGIT2BIN units, and there would be 10 levels of 3:2 carry-save adders.

The systems and processes described in this detailed description may be used in any application requiring decimal calculations, including (but not limited to) applications of: finance, taxation, investments, transportation, commerce, energy consumption, energy pricing/purchasing, etc. Moreover, any system and/or process described in this detailed description may be used to implement decimal function units including, for example, BID Adders, BID Multipliers, etc.

Figure 7:
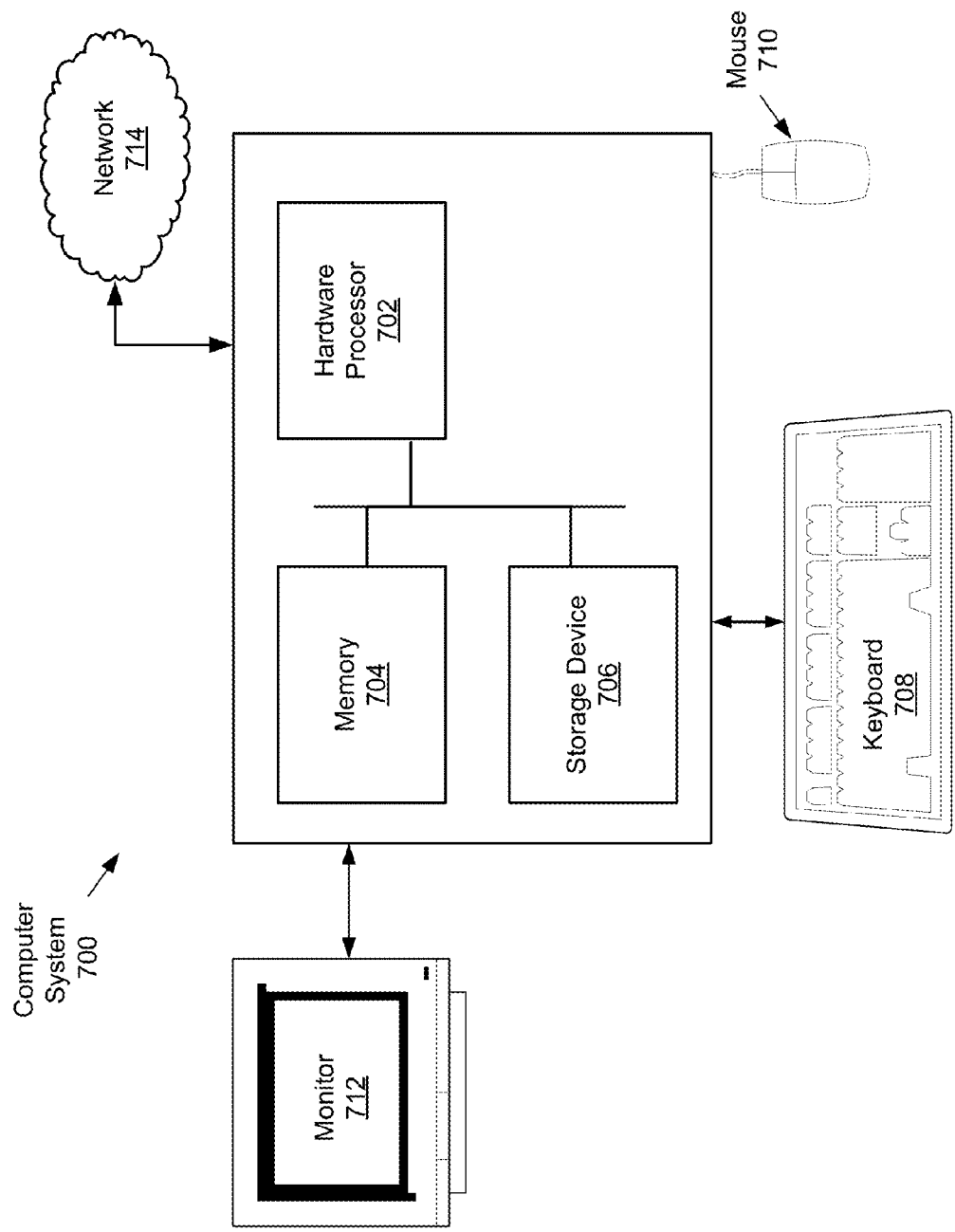
FIG. 7 shows a computer system in accordance with one or more embodiments of the invention.

Embodiments of the invention may be implemented on virtually any type of computer regardless of the platform being used. For example, as shown in FIG. 7, a computer system (700) includes one or more hardware processor(s) (702) (such as a central processing unit (CPU), integrated circuit, etc.), associated memory (704) (e.g., random access memory (RAM), cache memory, flash memory, etc.), a storage device (706) (e.g., a hard disk, an optical drive such as a compact disk drive or digital video disk (DVD) drive, a flash memory stick, etc.), and numerous other elements and functionalities typical of today's computers (not shown). One or more of the system (200) components (e.g., DPD Hardware Decoder (205), BCD/Binary Hardware Converter (210), Input Decoding Unit (220), and Output Formulation Hardware Unit (215)) may be located on the hardware processor (702). The computer system (700) may also include input means, such as a keyboard (708), a mouse (710), or a microphone (not shown). Further, the computer system (700) may include output means, such as a monitor (712) (e.g., a liquid crystal display (LCD), a plasma display, or cathode ray tube (CRT) monitor). The computer system (700) may be connected to a network (714) (e.g., a local area network (LAN), a wide area network (WAN), the Internet, or any other type of network) via a network interface connection (not shown). Those skilled in the art will appreciate that many different types of computer systems exist, and the aforementioned input and output means may take other forms. Generally speaking, the computer system (700) includes at least the minimal processing, input, and/or output means necessary to practice embodiments of the invention.

Further, in one or more embodiments of the invention, one or more elements of the aforementioned computer system (700) may be located at a remote location and connected to the other elements over a network. Further, embodiments of the invention may be implemented on a distributed system having a plurality of nodes, where each portion of the invention may be located on a different node within the distributed system. In one embodiment of the invention, the node corresponds to a computer system. Alternatively, the node may correspond to a processor with associated physical memory. The node may alternatively correspond to a processor or micro-core of a processor with shared memory and/or resources. Further, software instructions in the form of computer readable program code to perform embodiments of the invention may be stored, temporarily or permanently, on a non-transitory computer readable storage medium, such as a compact disc (CD), a diskette, a tape, a hard drive, punch cards, memory, or any other tangible computer readable storage device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method, comprising:
obtaining a binary coded decimal (BCD) significand corresponding to a plurality of decimal digits;
generating, by a BCD/binary hardware converter and based on the BCD significand, a plurality of binary vectors corresponding to the plurality of decimal digits by:
selecting, using a first multiplexer, a first vector component of a first binary vector based on a decimal digit having a weight of w in the BCD significand; and
selecting, using a second multiplexer, a second vector component of the first binary vector based on the decimal digit having the weight of w,
wherein the first multiplexer and the second multiplexer input at least a binary representation of decimal 1 w, a shifted version of the binary representation of decimal 1 w, a binary representation of decimal 3 w, and a shifted version of the binar representation of decimal 3 w; and
calculating, by the BCD/binary hardware converter, a binary output by summing the plurality of binary vectors.

2. The method of claim 1, further comprising:
obtaining a densely packed decimal (DPD) encoding of a decimal floating point number comprising the plurality of decimal digits;
extracting, by a DPD hardware decoder, a trailing significand and a first plurality of BCD bits corresponding to a most significant digit from the DPD encoding of the decimal floating point number;
converting, by the DPD hardware decoder, the trailing significand to a second plurality of BCD bits; and
generating the BCD significand by concatenating the first plurality of BCD bits and the second plurality of BCD bits.

3. The method of claim 2, further comprising:
extracting a plurality of leading exponent bits and a plurality of partial exponent bits from the DPD encoding; and
generating, by an output formulation hardware unit, a binary integer decimal (BID) encoding of the decimal floating-point number based on the binary output, the leading exponent bits, and the partial exponents bits.

4. The method of claim 2, wherein the DPD encoding has a cardinality of 64 bits, and wherein the BID encoding has a cardinality of 64 bits.

5. The method of claim 1, wherein generating the plurality of binary vectors further comprises:
selecting, using a third multiplexer, a first vector component of a second binary vector based on a decimal digit having a weight of 10 in the BCD significand; and
selecting, using a fourth multiplexer, a second vector component of the second binary vector based on the decimal digit having the weight of 10,
wherein the third multiplexer and the fourth multiplexer input at least a binary representation of decimal 10, a shifted version of the binary representation of decimal 10, a binary representation of decimal 30, and a shifted version of the binary representation of decimal 30.

6. The method of claim 1, wherein calculating the binary output comprises:
inputting the plurality of binary vectors into a carry-save adder tree comprising a plurality of levels of 3:2 carry-save adders feeding into a binary adder.

7. A system, comprising:
a binary coded decimal (BCD)/binary hardware converter configured to input a BCD significand corresponding to a plurality of decimal digits and comprising:
a DIGIT2BIN block, comprising at least a first DIGIT2BIN unit and a second DIGIT2BIN unit, and configured to generate, based on the BCD significand, a plurality of binary vectors corresponding to the plurality of decimal digits; and
a carry-save adder tree, operatively connected to the DIGIT2BIN block, comprising:
a binary adder configured to calculate a binary output based on the plurality of binary vectors; and
a plurality of levels of 3:2 carry-save adders feeding into the binary adder.

8. The system of claim 7, further comprising:
a densely packed decimal (DPD) hardware decoder operatively connected to the BCD/binary hardware converter and configured to:
input a DPD encoding of a decimal floating point number comprising the plurality of decimal digits;
extract a trailing significand and a first plurality of BCD bits corresponding to a most significant digit from the DPD encoding;
convert the trailing significand to a second plurality of BCD bits; and
generate the BCD significand by concatenating the first plurality of BCD bits and the second plurality of BCD bits.

9. The system of claim 8, further comprising:
an output formulation hardware unit operatively connected to the BCD/binary hardware converter and configured to generate a binary integer decimal (BID) encoding of the decimal floating point number based on the binary output.

10. The system of claim 8, wherein the DPD encoding has a cardinality of 64 bits, and wherein the BID encoding has a cardinality of 64 bits.

11. The system of claim 7, wherein the first DIGIT2BIN unit comprises:
a first multiplexer configured to select a first vector component of a first binary vector based on a decimal digit having a weight of w in the BCD significand; and
a second multiplexer configured to select a second vector component of the first binary vector based on the decimal digit having the weight of w,
wherein the first multiplexer and the second multiplexer input at least a binary representation of decimal 1 w, a shifted version of the binary representation of decimal 1 w, a binary representation of decimal 3 w, and a shifted version of the binary representation of decimal 3 w.

12. The system of claim 11, wherein the second DIGIT2BIN unit comprises:
a third multiplexer configured to select a first vector component of a second binary vector based on a decimal digit having a weight of 10 in the BCD significand; and
a fourth multiplexer configured to select a second vector component of the second binary vector based on the decimal digit having the weight of 10,
wherein the third multiplexer and the fourth multiplexer input at least a binary representation of decimal 10, a shifted version of the binary representation of decimal 10, a binary representation of decimal 30, and a shifted version of the binary representation of decimal 30.

13. The system of claim 7, wherein the first DIGIT2BIN unit comprises:
a first multiplexer configured to select a first internal binary vector based on a decimal digit having a weight of w in the BCD significand;
a second multiplexer configured to select a second internal binary vector based on the decimal digit having the weight of w;
a third multiplexer configured to select a third internal binary vector based on the decimal digit having the weight of w; and
a first adder configured to generate a first binary vector by adding the first internal binary vector, the second internal binary vector, and the third internal binary vector,
wherein the first multiplexer, the second multiplexer, and the third multiplexer input at least a binary representation of decimal 1 w, a shifted version of the binary representation of decimal 1 w, and a double shifted version of the binary representation of decimal 1 w.

14. The system of claim 13, wherein the second DIGIT2BIN unit comprises:
a fourth multiplexer configured to select a fourth internal binary vector based on a decimal digit having a weight of 10 in the BCD significand;
a fifth multiplexer configured to select a fifth internal binary vector based on the decimal digit having the weight of 10 in the BCD significand;
a sixth multiplexer configured to select a sixth internal binary vector based on the decimal digit having the weight of 10 in the BCD significand; and
a second adder configured to generate a second binary vector by adding the fourth internal binary vector, the fifth internal binary vector, and the sixth internal binary vector,
wherein the fourth multiplexer, the fifth multiplexer, and the sixth multiplexer input at least a binary representation of decimal 10, a shifted version of the binary representation of decimal 10, and a double shifted version of the binary representation of decimal 10.

15. A method, comprising:
obtaining a binary coded decimal (BCD) significand corresponding to a plurality of decimal digits;
generating, by a BCD/binary hardware converter and based on the BCD significand, a plurality of binary vectors corresponding to the plurality of decimal digits by:
selecting, using a first multiplexer, a first internal binary vector based on a decimal digit having a weight of w in the BCD significand;
selecting, using a second multiplexer, a second internal vector value based on the decimal digit having the weight of w;
selecting, using a third multiplexer, a third internal vector value based on the decimal digit having the weight of w; and
generating a first binary vector by adding the first internal binary vector, the second internal binary vector, and the third internal binary vector,
wherein the first multiplexer, the second multiplexer, and the third multiplexer input at least a binary representation of decimal 1 w, a shifted version of the binary representation of decimal 1 w, and a double shifted version of the binary representation of decimal 1 w; and calculating, by the BCD/binary hardware converter, a binary output by summing the plurality of binary vectors.

16. The method of claim 15, further comprising:

obtaining a densely packed decimal (DPD) encoding of a decimal floating point number comprising the plurality of decimal digits;

extracting, by a DPD hardware decoder, a trailing significand and a first plurality of BCD bits corresponding to a most significant digit from the DPD encoding of the decimal floating point number;

converting, by the DPD hardware decoder, the trailing significand to a second plurality of BCD bits; and generating the BCD significand by concatenating the first plurality of BCD bits and the second plurality of BCD bits.

17. The method of claim 16, further comprising:

extracting a plurality of leading exponent bits and a plurality of partial exponent bits from the DPD encoding; and generating, by an output formulation hardware unit, a binary integer decimal (BID) encoding of the decimal floating-point number based on the binary output, the leading exponent bits, and the partial exponents bits.

18. The method of claim 16, wherein the DPD encoding has a cardinality of 64 bits, and wherein the BID encoding has a cardinality of 64 bits.

19. The method of claim 15, wherein generating the plurality of binary vectors further comprises:

selecting, using a fourth multiplexer, a fourth internal binary vector based on a decimal digit having a weight of 10 in the BCD significand;

selecting, using a fifth multiplexer, a fifth internal binary vector based on the decimal digit having the weight of 10;

selecting, using a sixth multiplexer, a sixth internal binary vector based on the decimal digit having the weight of 10; and generating a second binary vector by adding the fourth internal binary vector, the fifth internal binary vector, and the sixth internal binary vector, wherein the fourth multiplexer, the fifth multiplexer, and the sixth multiplexer input at least a binary representation of decimal 10, a shifted version of the binary representation of decimal 10, and a double shifted version of the binary representation of decimal 10.

20. The method of claim 15, wherein calculating the binary output comprises:

inputting the plurality of binary vectors into a carry-save adder tree comprising a plurality of levels of 3:2 carry-save adders feeding into a binary adder.

* * * * *